United States Patent [19]
Sriram et al.

[11] Patent Number: 5,925,895
[45] Date of Patent: Jul. 20, 1999

[54] SILICON CARBIDE POWER MESFET WITH SURFACE EFFECT SUPRESSIVE LAYER

[75] Inventors: Saptharishi Sriram, Monroeville; Rowland C. Clarke, Bell Twp., both of Pa.

[73] Assignee: Northrop Grumman Corporation, Los Angeles, Calif.

[21] Appl. No.: 08/812,227

[22] Filed: Mar. 6, 1997

Related U.S. Application Data

[63] Continuation of application No. 08/544,626, Oct. 18, 1995, abandoned, which is a continuation of application No. 08/138,778, Oct. 18, 1993, abandoned.

[51] Int. Cl.$^6$ .................. H01L 31/0312; H01L 29/12
[52] U.S. Cl. .............................................. 257/77; 257/613
[58] Field of Search ....................... 257/77, 613; 437/100

[56] References Cited

U.S. PATENT DOCUMENTS

| | | | |
|---|---|---|---|
| 4,757,028 | 7/1988 | Kondoh et al. | 437/40 |
| 4,762,806 | 8/1988 | Suzuki et al. | 437/100 |
| 4,897,710 | 1/1990 | Suzuki et al. | 257/77 |
| 5,043,777 | 8/1991 | Sriram | 257/192 |
| 5,135,885 | 8/1992 | Furukawa et al. | 437/100 |
| 5,270,554 | 12/1993 | Palmour | 257/77 |

FOREIGN PATENT DOCUMENTS

| 0518683A1 | 12/1992 | European Pat. Off. | 257/77 |
|---|---|---|---|

OTHER PUBLICATIONS

"Silicon processing for the VLSI era", by Wolf, p. 273, 274, 276, Nov., 1990.

"High Temperature Operated Enhancement–type SS–SiC MOSFET", Nov. 1, 1988, *Japanese Journal of Applied Physics*, vol. 27, NR 11, pp. 2143–2145, XP000096753, Hiroo Fuma et al.

"SiC Microwave Power MESFET's and JFET's", *Compound Semiconductors 1994*, Sep. 18, 1994, San Diego, Sep. 18–22, 1994, NR. Proc. 21, pp. 389–394, (EDS) XP000509697, Weitzel et al.

"Silicon Carbide MOSFET Technology", *Solid State Electronics*, Nov., 1996, vol. 39, NR. 11, pp. 1531–1542, Brown, D.M. et al, XP000635611.

"The Potential of Diamond and SiC Electronic Devices for Microwave and Millimeter–Wave Power Applications" by Robert Trew, Jing–Bang Yan and Philip Mock, Proceedings of the IEEE, vol. 79 No. 5 May 1991.

"Thin Film Deposition and Microelectronic and Optoelectronic Device Fabrication and Characterization in Monocrystalline Aloha and Beta Silicon Carbide" by Robert F. Galina Kelner, Michael Shur John Palmour and John Edmond, Proceedings of the IEEE, vol. 79 No. 5 May 1991.

*Primary Examiner*—Steven H. Loke
*Attorney, Agent, or Firm*—Walter G. Sutcliff

[57] ABSTRACT

A silicon carbide metal semiconductor field effect transitor fabricated on silicon carbide substrate with a layer which suppresses surface effects, and method for producing same. The surface-effect-suppressive layer may be formed on exposed portions of the transistor channel and at least a portion of each contact degenerate region. The surface-effect-suppressive layer may be made of undoped silicon carbide or of an insulator, such as silicon dioxide or silicon nitride. If the surface-effect-suppressive layer is made of silicon dioxide, it is preferred that the layer be fabricated of a combination of thermally-grown and chemical vapor deposition deposited silicon dioxide.

7 Claims, 3 Drawing Sheets

SILICON CARBIDE POWER MESFET WITH SURFACE EFFECT SUPRESSIVE LAYER

This application is a continuation of application Ser. No. 08/544,626, filed Oct. 18, 1995, now abandoned, which is a continuation of application Ser. No. 08/138,778, filed Oct. 18, 1993, now abandoned.

BACKGROUND OF THE INVENTION

1. Field of the Invention

This invention relates to field effect transistors (FETS) and in particular to power FETs, and especially to those made of silicon carbide, such as silicon carbide MESFET, having an improved structure which permits them to operate more efficiently at high power at radio frequency (RF) frequencies.

2. Description of the Prior Art

A FET device that can deliver RF power with high gain and satisfactory efficiency is a requirement for many system applications. A device commonly used for these applications is the metal-semiconductor field effect transistor (MESFET). The MESFET is an attractive microwave device for implementation in wide bandgap semiconductor due to its simple structure, ease of fabrication and excellent RPF performance.

Prior to the availability of large diameter, high-quality, monocrystalline silicon carbide (SiC) substrates, gallium arsenide (GaAs) had been preferred over silicon (Si) materials for high frequency applications under extreme conditions. This is, in part, because GaAs possesses a wider energy bandgap, higher peak electron velocity, greater radiation tolerance and a wider operating temperature range than Si. However, the thermal conductivity of GaAs is low (0.46 W/cm-°C.) as compared to Si (1.5 W/cm-°C.). This characteristic limits the usefulness of GaAs in high-power, high-density circuits operating under extreme temperatures. While GaAs provides a semi-insulating substrate which reduces device and interconnection capacitance, and makes the material ideal for an all-ion-implanted planar device technology, it lacks a high-quality native oxide. Without this oxide, reliable surface passivation is usually unavailable, causing GaAs MESFET devices to exhibit less-than-desirable performance in some high-frequency, high-power applications such as RF systems.

In U.S. Pat. No. 5,043,777 ('777 patent), Sriram sought to reduce the surface layer current flow in GaAs MESFETs, which he believed to be associated with free arsenic at the device surface, by growing an undoped GaAs surface layer upon, and lattice-matched to, the free surface of the n channel layer. This undoped lattice-matched surface layer extended at least between the source and drain n+ regions, and was intended to separate the surface charges from the MESFET active layers, thus minimizing their influence on device characteristics. one mechanism by which the undoped layer is thought to work is to increase the pinch-off voltage in the gate-drain region without producing any additional amount of undepleted charge as compared to prior GaAs device structures. In the '777 patent, Sriram suggested that these surface effects may be common to those MESFETs and high electron mobility transistors made of elements from groups III–V of the periodic table.

Silicon carbide (SiC) is a wide energy bandgap (3 eV) semiconductor which is an attractive material for fabrication of RF power MESFETs due to its unique combination of high saturated electron velocity ($2.0 \times 10^7$ cm/s), high junction breakdown voltage ($5 \times 10^6$ V/cm), high thermal conductivity (5 W/cm-°C.) and broad operating temperature range (1100° C.). Indeed, the thermal conductivity and breakdown voltage values for SiC are an order of magnitude greater than conventional semiconductor materials, such as Si, GaAs and Indium phosphide. In addition, the energy band gap and, therefore, the maximum operating temperature range of SiC, is at least twice that of conventional semiconductors.

These features are important to systems such as radar, which demand very high RF power requirements of system components, and avionics, which require stable device behavior under extreme operating temperatures. Also, because the sic crystal lattice is inherently tolerant to radiation, the operations of devices fabricated from SiC are less susceptible to the effects of radiation than conventional semiconductor materials. As a result, SiC devices are useful in high radiation environments, including nuclear system and space applications.

Silicon carbide MESFETs with excellent DC and small-signal characteristics have been fabricated which showed drain currents greater than 200 mA/mm and a breakdown voltage of greater than 100 volts. Such devices have also developed a small-signal gain of around 12 dB at 2 GHz. However, when operated as a power device, the power output was significantly lower than that predicted from the DC current-voltage (I–V) characteristics and, under pulsed current conditions, was actually less than DC current values. The origin of this untoward effect is unknown but is believed to be due to certain phenomena, collectively called "surface effects", which may include, for example, current flow in the surface of the device between the drain and the gate of the MESFET. This current flow can cause transconductance dispersion and other parasitic surface effects, as well as other unknown effects. Despite the clearly advantageous properties of SiC MESFETs, these devices could not successfully be fabricated heretofore for high RF power operations under extreme conditions.

There is a need, therefore, for a SiC MESFET which can operate at high power in the RF bands with sufficient efficiency.

SUMMARY OF THE INVENTION

This need and others are satisfied by the invention which is directed to power FETs that includes a surface-effect-suppressive (SES) layer. The SES layer is formed on one side of the degenerate layer which is interposed between an electrically active channel layer and source and drain metal contacts.

In the presently preferred embodiment, the SES layer is grown to cover one side of both degenerate regions, which are preferred to be of n+type, except for the source and drain contacts, and to cover at least the portion of channel layer, preferably of n type, which lies between the degenerate regions.

This invention is directed to FETs, particularly to those having a buffer layer, preferably of the p type, grown upon the substrate, an channel layer grown upon the buffer layer, a pair of n+ regions spaced apart by the n channel layer, metal drain and source contacts affixed to the respective n+ regions, a SES layer which is grown on one side of both n+ regions, and, at least on that portion of the n channel which is interposed between the n+ regions, and a gate contact which extends through the SES layer and is affixed to the n channel layer interposed between the source and drain contacts.

This invention may be applied to semiconductor devices such as a MESFET. The SES layer may be composed of either a silicon carbide material or an insulator. If it is made of silicon carbide, the SES layer may be composed of high-purity, undoped, or lightly doped silicon carbide. In this case, the SES layer is grown beneath the n+ contacts and above the n channel layer, and a lattice-matched SES layer is preferred. However, if the SES layer material is an insulator, the layer is grown on the surface of the n+ regions as well as the exposed surface of the n channel between the respective n+ regions. Suitable insulators include materials such as, for example, silicon dioxide, silicon nitride, aluminum oxide and titanium oxide.

The thickness of the SES layer is sufficient to quench the surface current effects, and permit no substantial conduction at the interface between the channel and the SES layer. A suitable thickness for the SES layer can range from about 500 Angstroms to about 5000 Angstroms, although a thickness of about 2000 Angstroms may probably be preferred.

This invention is applicable to FETs made of silicon carbide, and in particular MESFETs made of silicon carbide.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE PREFERRED EMBODIMENTS

Figure 1:
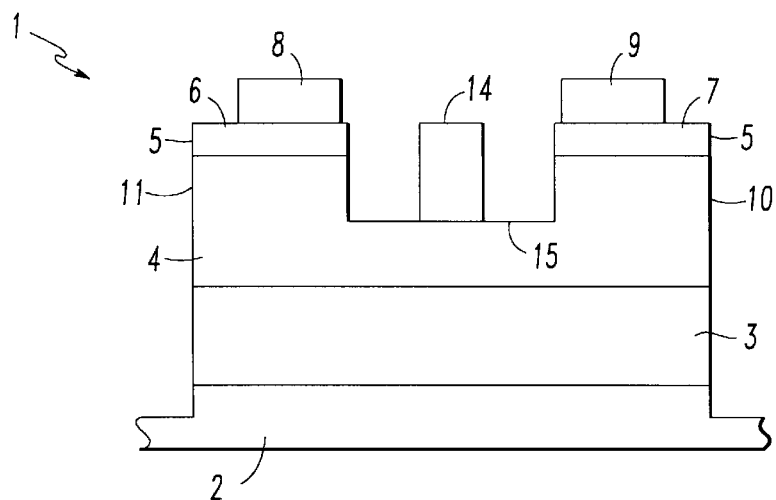
FIG. 1 is a schematic section through a prior art SiC MESFET illustrating a device lacking a surface-effect-suppressive layer.

The invention provides SiC FET structures, and processes for fabricating these FET structures, which can be used to produce high-power, high-frequency signals efficiently under extreme conditions. Although the presently preferred embodiment of the present invention is described with respect to a MESFET, it must be understood that the present invention may be practiced with respect to other types of field-effect transistors, such as, for example, the metal-oxide semiconductor field-effect transistor (MOSFET) or the junction field-effect transistor (JFET).

A surface-effect-suppressive (SES) layer is selectively integrated into a Sic MESFET. A suitable thickness for the SES layer can range from about 500 Angstroms to about 5000 Angstroms, although a thickness of about 2000 Angstroms is preferred. It is preferred to provide a SiC substrate upon which may be formed a buffer layer. The buffer layer is preferably made of higher-sensitivity p material. Upon the buffer layer may be formed an electrically active channel layer which is preferably made of high-resistivity n type SiC. However, it is to be distinctly understood that the buffer layer may be made of n type layer and the channel layer could be made of p type material.

The SES layer may be formed from a layer of substantially undoped silicon carbide or an insulator. It is preferred that, when an undoped layer of SiC is used as an SES, that the SES is epitaxially grown. The formation of an insulating layer such as, for example, silicon dioxide upon the surface of the silicon carbide device by thermal and chemical vapor deposition (CVD) methods is well-known.

In one preferred embodiment, the surface-effect-suppressive layer, composed of silicon carbide material, may be formed upon the channel layer. Although the SES layer of this embodiment is preferred to be undoped SiC, highly-purified or lightly-doped SiC may also be used. A highly-doped degenerate layer may be formed upon the SES layer and can be used to reduce the resistance between a metal contact and the active channel layer. It is preferred that the degenerate regions are made of n+ material, and are formed by ion implantation or by epitaxial growth, although materials with other conductivity types, and other film formation methods, may be used. In this embodiment, the degenerate layer may be selectively removed to expose the SES layer, thereby electrically separating the source contact degenerate layer from the drain contact degenerate layer by creating two separate mesa-shaped structures. Because the electrically active channel layer remains covered by the SES layer, the gate-source and gate-drain surface effects can be substantially reduced and isolated from deleterious effects upon the channel layer. The gate contact in this embodiment may penetrate the SES layer and may be affixed to the channel layer for modulation of the signal therein.

In another embodiment, the degenerate layer may be formed upon the active channel layer, and may be selectively removed to form a source contact degenerate layer, a separate drain contact degenerate layer, and an exposed recess of channel layer material. In this embodiment, a SES layer, preferably composed of an insulator, can be formed onto the surface of exposed recess of channel layer material generally coextensively with exposed degenerate contact layers and with the exposed horizontal and vertical surfaces of the recess of channel layer material. The insulator-type SES layer of this embodiment is preferably composed of thermally-grown and deposited silicon dioxide but other insulators, such as, for example, silicon nitride, aluminum oxide and titanium oxide may also be used. The SES layer may be pierced by the gate metal contact for electrical connection with the active layer. In this embodiment, surface effects between source and gate, or drain and gate can be both minimized and physically isolated from the signals being propagated in the active channel layer therein.

Other details, objects and advantages of the invention will become apparent as the following description of present preferred embodiments thereof and a present preferred method of practicing the same proceeds. The accompanying drawings show presently preferred embodiments of the invention and a method of practicing the invention.

In FIG. 1, SiC MESFET 1 is shown in schematic section and is illustrative of prior art SiC MESFETs which lack a SES layer. Active channel layer 4 may be isolated from potentially deleterious interfacial effects with substrate 2 by the interposition of buffer layer 3. A highly-doped contact degenerate layer 5 is superposed and affixed to channel layer 4. Degenerate layer 5 can be selectively removed to form drain mesa 10 and source mesa 11, and to create gate contact recess 15 thereby exposing a portion of channel layer 4. Mesas 10, 11 may be used to isolate the source and drain regions and to separate the active channel regions from metal gate pads. The resistance between the channel and metal contact may be reduced by the presence of degenerate regions on the upper horizontal surfaces of mesas 10 and 11, namely drain contact degenerate layer 7 and source contact degenerate layer 6. Source ohmic metal contact 8 can be affixed to exposed source contact degenerate layer 6. Likewise, drain ohmic metal contact 9 can be affixed to drain contact degenerate layer 7.

During the operation of MESFET 1, a signal applied to gate contact 14 selectively controls current flow from source contact 8, into channel layer 4, and out to drain contact 9. Under small-signal conditions, a surface current flows between gate contact 14 and source contact 8 or gate contact 14 and drain contact 9 across the exposed surface of layers 4 and 7. Under small-signal conditions, this surface current does not adversely affect the current passing through the channel layer 4. However, when MESFET 1 is operated under RF power conditions, it is postulated that the surface current flow between gate 14 and layers 4 and 7 develops to a magnitude that substantially inhibits current flow in layer 4 and diminishes the power of the signal in channel layer 4 which is flowing between source contact 8 and drain contact 9.

Figure 2:
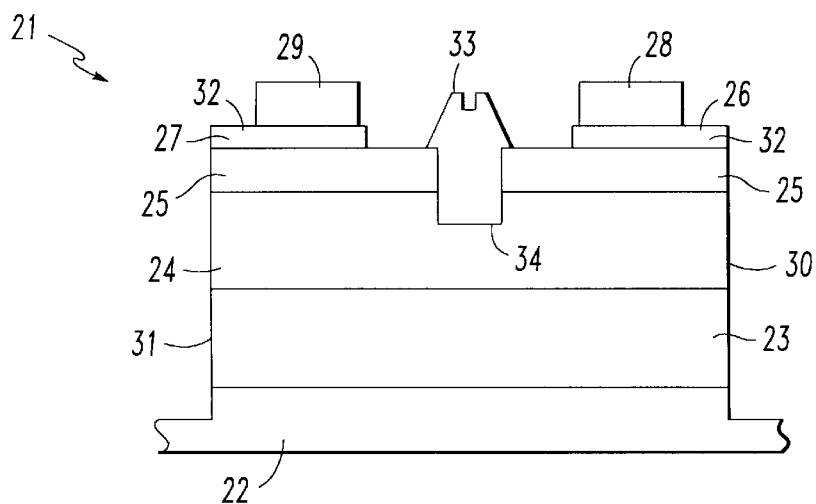
FIG. 2 is a schematic section through a MESFET in accordance with the current invention which implements a silicon carbide-based surface-effect-suppressive layer.

In FIG. 2, one embodiment of the invention herein is shown in schematic section. In SiC MESFET 21, active channel layer 24, preferably made of n type material, can be substantially electrically isolated by interposing buffer layer 23, preferably made of p type material, between layer 24 and substrate 22. Substrate 22 is preferably made of high resistivity type material. SES layer 25 can be formed on active channel layer 24. In this embodiment, it is preferred that substrate 22 and layers 23, 24 and 25 be composed of SiC. In addition, it is preferred that layers 23, 24 and 25 be single-crystal films of silicon carbide. Further, it is preferred that SES layer 25 be deposited by epitaxial methods on channel 24 thus reducing interfacial conduction at the channel SES layer interface. It is also preferred that SiC SES layer 25 be lattice-matched to layer 24. Layer 25 may be composed of undoped, lightly doped or highly purified silicon carbide. A highly-doped contact SiC degenerate layer 32, preferably made of n+ type material and preferably formed by ion implantation or epitaxial growth, may be superposed adjacent channel layer 24 and formed on interposed SES layer 25. Degenerate layer 32, and layer 25 beneath, may be selectively removed to expose a portion of channel layer 24, and form drain mesa 30 and source mesa 31. It is preferred that selective removal is performed by dry etching methods such as, for example, reactive ion etching (RIE) methods. Mesas 30, 31 may be used to isolate the source and drain regions and to separate the active channel regions from metal gate pads. The resistance between the channel and metal contact may be reduced by the presence of degenerate regions on the upper horizontal surfaces of mesas 30 and 31, namely drain contact degenerate layer 26 and source contact degenerate layer 27. Source ohmic metal contact 29 is affixed to source contact degenerate layer 27. Likewise, drain ohmic metal contact 28 is affixed to drain contact degenerate layer 26. A gate contact recess, 34, may be defined between mesas 30, 31 by selectively penetrating SES layer 25, and, in some embodiments, active channel layer 24, to a preselected depth. Gate metal is formed into recess 34, and superposed on channel layer 24, thereby creating gate metal contact 33. Where a MESFET is desired, metal contact 33 is superposed directly upon layer 24. Where a MOSFET is desired, a layer of silicon dioxide is interposed between metal contact 33 and layer 24. Where a JFET is desired, a p+ region is interposed between metal contact 33 and layer 24.

During operation of MESFET 21, a signal applied to gate contact 33 selectively controls current flow from source contact 29 into channel layer 24 and out to drain contact 28. Note that the electron flow between contacts 28 or 29 and the channel is effectively unimpeded by SES layer 25. In MESFET 1 of FIG. 1, a surface current flows between gate contact 14 and source contact 8, or gate contact 14 and drain contact 9 across the exposed surface of layer 4. Under small-signal conditions, this surface current does not adversely affect the current passing through the channel layer 4.

However, unlike MESFET 1 of FIG. 1, MESFET 21 of FIG. 2 does not suffer substantial inhibition of current in channel layer 24 or concomitant power loss under RF power conditions by gate-to-source or gate-to-drain surface current flow. It is hypothesized that SES layer 25 isolates the surface effects from channel layer 24 and thus generally reduces the influence of some surface effects on device behavior.

Figure 3:
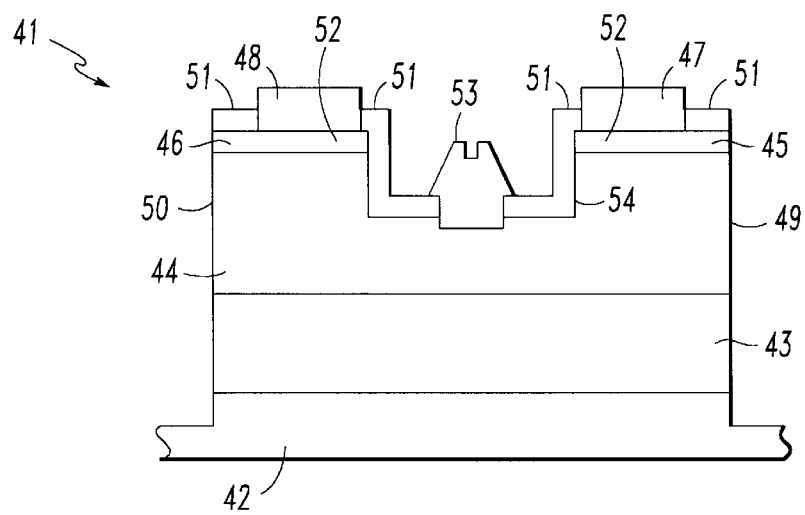
FIG. 3 is a schematic section through a MESFET in accordance with the current invention which implements an insulator-based surface-effect-suppressive layer.

In FIG. 3, a second embodiment of the invention herein is shown in schematic section. In SiC MESFET 41, active channel layer 44, preferably made of generally n type material, can be substantially electrically isolated by interposing buffer layer 43, preferably made of generally p type material, between substrate 42 and superposed layer 44. Substrate 42 is preferably of high resistivity type material. A highly-doped contact degenerate layer 52, preferably made of n+ type material and preferably formed by ion implantation or epitaxial growth, can be next superposed directly on layer 44. Degenerate layer 52 can be selectively removed to expose a portion of channel layer 44 and form drain mesa 49 and source mesa 50. Mesas 49, 50 may be used to isolate the source and drain regions and to separate the active channel regions from metal gate pads. The resistance between the channel and metal contact may be reduced by the presence of degenerate regions on the upper horizontal surfaces of mesas 49 and 50, namely drain contact degenerate layer 45 and source contact degenerate layer 46. Source ohmic metal contact 48 can be affixed to source contact degenerate layer 46. Likewise, drain ohmic metal contact 47 can be affixed to drain contact degenerate layer 45. In this presently preferred embodiment, surface-effect-suppressive layer 51 is an insulator which can be formed onto horizontal and vertical aspects of gate contact recess 54. In addition, layer 51 can be formed upon at least a portion of the selectively exposed portion of channel layer 44 and can extend to at least a portion of the surface of layers 45 and 46, except at the drain and source contacts, respectively. As in FIG. 2, it is preferred that layers 43, 44 and the degenerate layer which forms layers 45 and 46 each be composed of single-crystal films of silicon carbide. It is also preferred that, when silicon dioxide is the insulator, layer 51 be composed of a combination of thermal and CVD oxides. To create such layer 51, the exposed surfaces of layer 44 within well 54, and layers 45 and 46 first are oxidized thermally to fabricate a layer of silicon dioxide from silicon carbide. Next, layer 51 is augmented by CVD formation of silicon dioxide. A gate contact 53, may be defined between mesas 49, 50 by selectively penetrating SES layer 51, and possibly active channel layer 44, to a preselected depth and by superposing gate metal on channel layer 44.

Where a MESFET is desired, metal contact 53 is superposed directly upon layer 44. Where a MOSFET is desired, a layer of silicon dioxide is interposed between metal contact 53 and layer 44. Where a JFET is desired, a p+ region is interposed between metal contact 53 and layer 44.

Although it is preferred that SES layer 51 be formed such that it covers only the horizontal and vertical surfaces of well 54, SES layer 51 may extend beyond well 54 to cover at least a portion of each degenerate layer 45 and 46. In addition, degenerate layers 45, 46 can be selectively exposed to permit the deposition of source ohmic metal contact 48 and drain ohmic metal contact 47.

Like MESFET 21 of FIG. 2, MESFET 41 of FIG. 3 performs well under small-signal conditions and does not suffer substantial modulation of current in channel layer 44 or concomitant power loss under RF power conditions by gate-to-source or gate-to-drain surface current flow.

Figure 4:
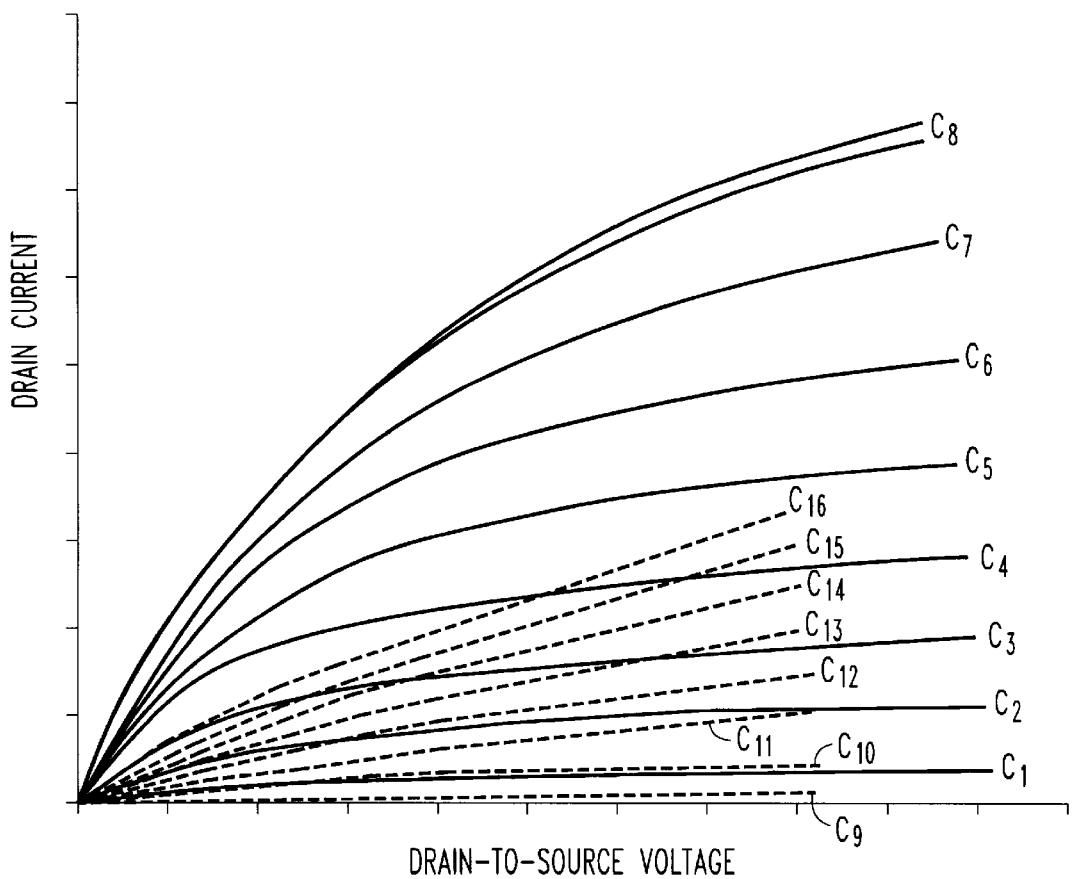
FIG. 4 is a diagrammatic representation of the current-voltage characteristic family of curves typical of a SiC MESFET lacking a surface-effect-suppressive layer.

FIG. 4 illustrates the pulse compression I–V characteristic family of curves which are typical of MESFETs which lack an SES layer. In general, characteristic curves, e.g., $C_1$–$C_8$, indicate drain current ($I_d$) (ordinate) as a function of drain-to-source voltage ($V_{ds}$) (abscissa), with each curve representing a particular value of gate-to-source bias ($V_{gs}$). Each horizontal division moving rightward in FIG. 4 represents a 1 volt increase in $V_{ds}$; each vertical division moving upward in FIG. 4 represents a 1 mA increase in $I_d$.

In FIG. 4, the unbroken tracings, $C_1$–$C_8$, are representative of I–V characteristic curves under a DC bias, whereas the broken tracings, $C_9$–$C_{16}$, represent the I–V characteristic curves for the prior art MESFET generated under pulsed bias conditions. The pulse duration is 80 microseconds. Each curve from curve family $C_1$–$C_8$ is paired with one curve from the curve family $C_9$–$C_{16}$, sharing a common value of $V_{gs}$. For example, $C_1$ represents the same value of $V_{gs}$ as does $C_9$, and $C_8$ represents the same value of $V_{gs}$ as does $C_{16}$. FIG. 4 shows that MESFET drain current, $I_d$, under pulsed bias conditions, is compressed to less than half of the value for a comparable $V_{gs}$ and $V_{ds}$ under DC conditions. As the frequency of $V_{gs}$ approaches radio frequencies, drain current degrades further, making the prior art MESFET unsuitable for high power operation at high (e.g., RF) frequencies.

Figure 5:
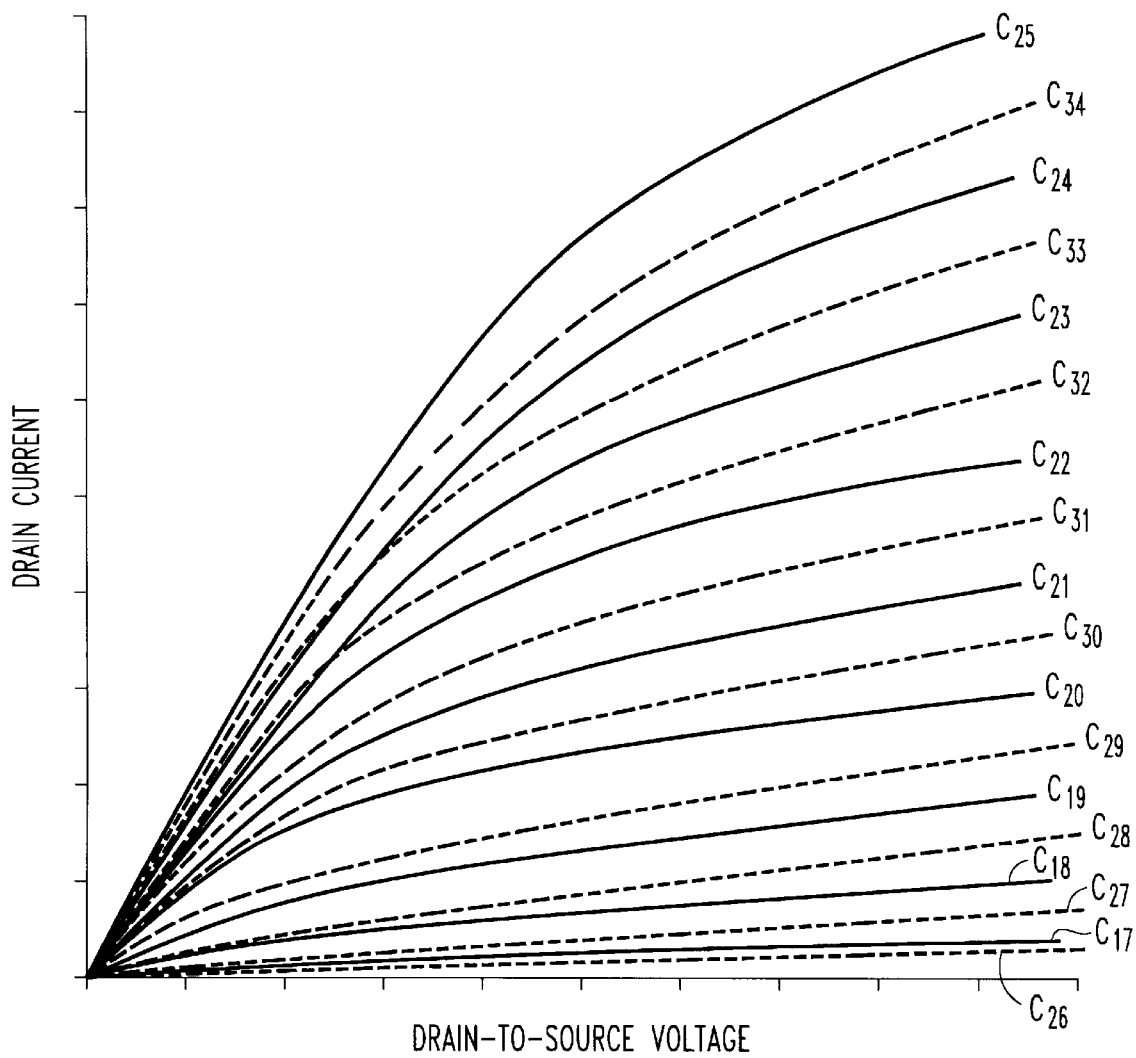
FIG. 5 is a diagrammatic representation of the current-voltage characteristic family of curves typical of a SiC MESFET which possesses a surface-effect-suppressive layer according to the present invention.

In FIG. 5, as in FIG. 4, each horizontal division moving rightward in FIG. 5 represents a 1 volt increase in $V_{ds}$; each vertical division moving upward in FIG. 5 represents a 1 mA increase in $I_d$. Also, each curve from curve family $C_{17}$–$C_{25}$ is paired with one curve from the curve family $C_{26}$–$C_{34}$, sharing a common value of $V_{gs}$. For example, $C_{17}$ represents the same value of $V_{gs}$ as does $C_{26}$, and $C_{25}$ represents the same value of $V_{gs}$ as does $C_{34}$.

In FIG. 5, the unbroken tracings, $C_{17}$–$C_{25}$, once again represent the I–V characteristic curves under a DC bias, whereas the broken tracings, $C_{26}$–$C_{34}$, represent the I–V characteristic curves under pulsed bias conditions. The pulse duration is 80 microseconds. However, in FIG. 5, the I–V characteristic curves of a MESFET fabricated with a surface-effect-suppressive layer are illustrated. Note that with the benefit of the SES, the MESFET I–V curves, $C_{26}$–$C_{34}$, under pulsed bias conditions more closely approximate comparable DC bias values, $C_{17}$–$C_{25}$. Drain current degradation at RF frequencies is also reduced, indicating the suitability of a MESFET with an SES-layer for high power RF operation.

While specific embodiments of the invention have been described in detail, it will be appreciated by those skilled in the art that various modifications and alternatives to those details could be developed in view of the overall teachings the disclosure. Accordingly, the particular arrangements disclosed are meant to be illustrative only and not limiting as to the scope of the invention which is to be given the full breadth of the appended claims and any all equivalents thereof.

We claim:

1. A field effect transistor comprising:

a silicon carbide substrate;

a silicon carbide n+ type channel layer positioned adjacent to said substrate;

a pair of silicon carbide n+ regions spaced apart and positioned adjacent to said channel layer;

a source contact affixed to one of said pair of n+ regions;

a drain contact affixed to the other of said pair of n+ regions;

a gate contact positioned adjacent to said channel layer intermediate said pair of n+ regions;

said channel layer being subject to an undesired surface current;

a surface-effect-suppressive layer which covers portions of a surface of said channel layer between said gate contact and each of said n+ regions and being operable to alter said portions of said surface in a manner to substantially minimize the effects of said undesired surface current;

the space above said surface-effect-suppressive layer defining respective gaps, on either side of said gate contact, said gaps being devoid of said surface-effect-suppressive layer; and wherein said gate contact is superposed directly on said channel layer, and said field effect transistor is a MESFET; and wherein said surface effect suppressive layer is formed on and is substantially coextensive with said channel layer except at said gate contact, and wherein said spaced apart n+ regions are formed upon said surface effect suppressive layer.

2. The field effect transistor of claim 1 wherein said surface-effect-suppressive layer is undoped silicon carbide.

3. A field effect transistor comprising:

a silicon carbide substrate;

a silicon carbide n+ type channel layer positioned adjacent to said substrate;

a pair of silicon carbide n+ regions spaced apart and positioned adjacent to said channel layer;

a source contact affixed to one of said pair of n+ regions;

a drain contact affixed to the other of said pair of n+ regions;

a gate contact positioned adjacent to said channel layer intermediate said pair of n+ regions;

said channel layer being subject to an undesired surface current;

a surface-effect-suppressive layer which covers portions of a surface of said channel layer between said gate contact and each of said n+ regions and being operable to alter said portions of said surface in a manner to substantially minimize the effects of said undesired surface current;

the space above said surface-effect-suppressive layer defining respective gaps, on either side of said gate contact, said gaps being devoid of said surface-effect-suppressive layer; and wherein said gate contact is superposed directly on said channel layer, and said field effect transistor is a MESFET;

said surface-effect-suppressive layer is a silicon dioxide insulator and is formed upon and covers at least a portion of each of said spaced apart n+ regions except at said source contact and said drain contact, and said surface-effect-suppressive layer is generally coextensive with said channel layer except at said gate contact; and wherein said silicon dioxide is comprised of a combination of thermally grown silicon dioxide and chemical-vapor-deposition-formed silicon dioxide.

4. The transistor of claim 3 wherein said surface-effect-suppressive layer has a thickness between about 500 and 5000 Angstroms.

5. The transistor of claim 3 wherein said surface-effect-suppressive layer has a thickness of about 2000 Angstroms.

6. A field effect transistor comprising:

a silicon carbide substrate;

a silicon carbide n type channel layer positioned adjacent to said substrate;

a pair of silicon carbide n+ regions spaced apart and positioned adjacent to said channel layer;

a source contact affixed to one of said pair of n+ regions;

a drain contact affixed to the other of said pair of n+ regions;

a gate contact positioned adjacent to said channel layer intermediate said pair of n+ regions;

said channel layer being subject to an undesired surface current;

a surface-effect-suppressive layer which covers portions of a surface of said channel layer between said gate contact and each of said n+ regions and being operable to alter said portions of said surface in a manner to substantially minimize the effects of said undesired surface current;

the space above said surface-effect-suppressive layer defining respective gaps, on either side of said gate contact, said gaps being devoid of said surface-effect-suppressive layer; and wherein a p+ silicon carbide region is interposed between said gate contact and said channel layers, and said field effect transistor is a JFET.

7. A field effect transistor comprising:

a silicon carbide substrate;

a silicon carbide n type channel layer positioned adjacent to said substrate;

a pair of silicon carbide n+ regions spaced apart and positioned adjacent to said channel layer;

a source contact affixed to one of said pair of n+ regions;

a drain contact affixed to the other of said pair of n+ regions;

a gate contact positioned adjacent to said channel layer intermediate said pair of n+ regions;

said channel layer being subject to an undesired surface current;

a surface-effect-suppressive layer which covers portions of a surface of said channel layer between said gate contact and each of said n+ regions and being operable to alter said portions of said surface in a manner to substantially minimize the effects of said undesired surface current;

the space above said surface-effect-suppressive layer defining respective gaps, on either side of said gate contact, said gaps being devoid of said surface-effect-suppressive layer; and wherein a silicon dioxide is interposed between said gate contact and said channel layer, and said field effect transistor is a MOSFET.

* * * * *